United States Patent [19]

Hamamsy

[11] 4,395,637
[45] Jul. 26, 1983

[54] OPTICALLY TOGGLED LATCH-FREE NORMALLY OFF SWITCH

[75] Inventor: Mahmoud A. E. Hamamsy, Watchung, N.J.

[73] Assignee: Bell Telephone Laboratories, Incorporated, Murray Hill, N.J.

[21] Appl. No.: 328,367

[22] Filed: Dec. 7, 1981

[51] Int. Cl.³ .............................................. G02B 27/00
[52] U.S. Cl. ..................................... 250/551; 307/311
[58] Field of Search .................. 250/551, 206, 214 R; 307/311; 357/19

[56] References Cited

U.S. PATENT DOCUMENTS 4,275,308  6/1981  Hamamsy ............................ 250/551
4,303,831  12/1981  Hamamsy ............................ 250/551
4,307,298  12/1981  Hamamsy et al. .................. 250/551

Primary Examiner—David C. Nelms
Assistant Examiner—Darwin R. Hostetter
Attorney, Agent, or Firm—Arthur J. Torsiglieri

[57] ABSTRACT

A normally-OFF switch includes a transistor branch path and a parallel pair of oppositely poled thyristor branch paths to protect against voltage surges. To minimize latching-on of the thyristors as a result of voltage surges, the thyristor branch paths including light emitting diodes which light up when excess current flows in the thyristor branch paths and actuate a photodiode array which biases the transistor path to conduction to divert excess current from the thyristor path.

6 Claims, 1 Drawing Figure

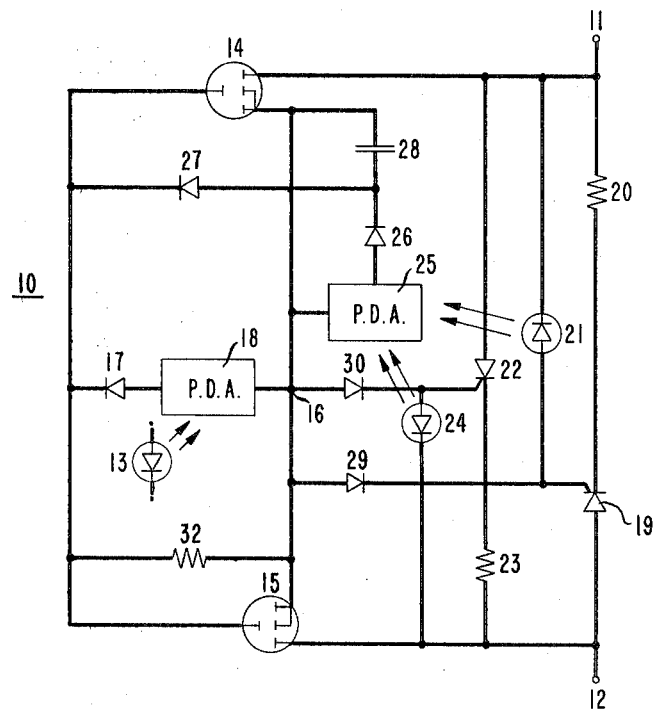

4,395,637

OPTICALLY TOGGLED LATCH-FREE NORMALLY OFF SWITCH

TECHNICAL FIELD

This relates to a normally OFF solid-state switch which is turned on optically.

BACKGROUND OF THE INVENTION

There is a need especially in telecommunications for a switch which can switch both ac and dc currents, can take current surges of either polarity, can interrupt dc loop currents, and has linear through-the-origin current voltage characteristics.

To satisfy this need, there have been proposed, hitherto, switches which include field-effect transistors whose conduction state has been controlled by optical illumination. Typically, such switches include a field-effect transistor biased to be normally off, which is turned on when light is incident on a photovoltaic element connected to provide an appropriate turn-on bias in the gate-bias circuit of the transistor. It has also been recognized that for increasing the current-handling capacity of the transistor, as for example to adapt it for surge protection, it is advantageous to include in shunt with the field-effect transistor a thyristor which is truned on when current through the transistor exceeds a threshold value, whereby enough gate current is applied to the thyristor to turn it on. Once turned on, the thyristor can serve as a second main current path through the switch, permitting use in the switch of a transistor of lower current-handling capacity than is to be handled by the switch.

However, it is a characteristic of thyristors that once turned on they tend to continue in this state so long as a minimum holding current is maintained through the thyristor even though the gate triggering current has been removed. In many possible applications of a solid-state switch of the kind involved, in normal operation there is continuously being applied across the switch terminals operating voltages of a magnitude sufficient to maintain a current through the switch larger than the minimum holding current if there is no other path available for the current, as when the transistor path is open because the transistors are properly in a nonconducting state as the result of the absence of an "ON" control signal. In this case, a thyristor, once triggered on by a voltage surge in performing its protective role, tends to continue to conduct even though the surge subsides and the control signal is off. This action is described as latching on. This tendency makes for unreliable operation of the switch.

SUMMARY OF THE INVENTION

The invention is an optically-toggled normally-OFF surge-protected switch with a latch-free capability.

In particular, a switch made up of a transistor circuit branch and a thyristor circuit branch in accordance with the invention includes provision for optical feedback from the thyristor branch to the transistor branch to prevent latching in the ON state when abnormal surges are no longer being applied across the switch and the switch is intended to be open.

In an illustrative embodiment, there is included in each thyristor circuit branch a light emitting diode which emits light when the associated thyristor is conducting abnormally high currents. Each such diode is optically coupled to a photosensitive element which is adapted to provide a photovoltaic voltage adequate to turn on the transistors in the alternate conduction branch of the switch for a time sufficient to divert enough current from the thyristor branch that the current in such branch is reduced to a magnitude below the holding level whereby the thyristor is turned off.

In a preferred illustrative embodiment, a pair of normally off enhancement-type field-effect transistors are connected so that their main conduction paths are in series between a pair of main terminals and form the transistor branch. Also connected across the terminals to provide shunt paths are a parallel pair of oppositely-poled thyristor branches. Each latter branch includes the main path of a thyristor in series with a parallel arrangement of a resistor and a light-emitting diode. The gate of each thyristor is connected to the node between the two transistors in the transistor branch. Each of the light-emitting diodes is optically coupled to a photodiode array connected in the gate-bias circuit of the transistors so that when illuminated the photovoltaic voltage generated biases the transistors to conduction. Normal switching control is provided by a separate light-emitting diode which is optically coupled to another photodiode array which when illuminated generates a photovoltaic voltage in the gate-bias circuit of the transistors to bias them on.

In operation, normal control of the switch is provided by control of the last-mentioned light-emitting diode. However, even though it may be off, voltage surges across the main terminals will turn on the appropriately poled thyristor which will conduct abnormally high currents, particularly because the transistor path is open and is unable to divert any of the current. Such abnormal thyristor current will turn on the corresponding light-emitting diode and its coupled photodiode array will thereafter bias the transistors to conduction for a time sufficient that there can be diverted enough current from the conducting thyristor path to turn off the included thyristor.

BRIEF DESCRIPTION OF THE DRAWING

With reference now to the drawing, the FIGURE shows in schematic circuit form a bilateral optical switch in accordance with the preferred embodiment of the invention.

DETAILED DESCRIPTION

In the drawing, the switch 10 is connected between the main terminals 11 and 12 between which it is desired to control the ON or OFF state as a function of the condition of an optical control source provided by the light-emitting diode 13.

One conduction path forming the transistor branch between terminals 11 and 12 is provided by the series combination of the main conduction paths of enhancement-mode MOS field-effect transistors 14,15. These may be of any suitable variety, including known DMOS and VMOS forms. Transistors 14 and 15 have their gate electrodes connected together and the gate electrodes are connected to the common node point 16 between the transistors by way of a blocking diode 17 and a photosensitive element 18, typically a photodiode array. A light source 13, typically a light-emitting source, to which are applied the control signals for the switch, is optically coupled to the photodiode array 18. A large resistance 32 provides a discharge path between node 16 and the gates of the transistor when the photodiode array 18 is turned off.

Another conduction path forming a first thyristor branch between terminals 11 and 12 is provided by way of the series combination of the main conduction path of the thyristor 19 and the resistor 20. A light-emitting diode 21 also is connected between the gate of thyristor 19 and the terminal 11 in parallel with the resistor 20.

Another conduction path forming a second thyristor branch between terminals 11 and 12 is provided by way of the series combination of the main conduction path of the oppositely-poled thyristor 22 and the resistor 23. The light-emitting diode 24 is connected between the gate of thyristor 22 and the terminal 12.

Each of LEDs 21 and 24 is optically coupled to a photosensitive element 25, typically a photodiode array, one terminal of which is connected to the node 16 and the other terminal of which is connected by way of the series of blocking diodes 26 and 27 to the common connection of the gate electrodes of transistors 14 and 15. The photodiodes and blocking diodes are appropriately poled so that the photovoltaic voltage developed is transmitted to the gate-bias circuit of transistors 14 and 15 to bias them on when sufficient light is emitted by either of the LEDs 21,24. A capacitor 28 advantageously is connected in shunt across the photodiodes 25 and the blocking diode 26 to introduce delay and prolong the current flow. The gates of thyristors 19 and 22 are connected to the node 16 by way of diodes 29 and 30, respectively, poled to pass triggering currents from the node 16 to the gate of the appropriate thyristor for either direction of flow.

In operation, in the absence of illumination from the light source 13 and the absence of abnormally high voltages on terminals 11 and 12 sufficient to turn on thyristors 19 and 22, neither transistor nor thyristor will be biased on, and consequently a high resistance will exist between terminals 11 and 12. When the light source 13 is turned on, and a photovoltaic voltage set up by photodiode array 18, the transistors 14 and 15 will be biased for conduction and operating voltage differences of either polarity between the terminals 11 and 12 will give rise to current flow past node 16. If this current is sufficient, it will provide turn-on current by way of the gate to the appropriate thyristor and turn it on. The particular thyristor affected will be determined by the polarity of the voltage difference between terminals 11 and 12. The LEDs associated with these thyristors are designed so that for the normal range of operating voltages between terminals 11 and 12, the current flow through the appropriate thyristor is insufficient to light up the associated LED sufficiently to develop a voltage large enough from the associated photodiode 25 to much affect the conduction of the transistors 14,15.

Accordingly, when light source 13 is extinguished and photodiode array 18 is no longer illuminated, transistors 14,15 will be turned off and this turn-off will not be prevented by any action on the part of photodiode array 25. It is seen therefore that under normal conditions, LEDs 21 and 24 and photodiode array 25 play no active role.

However, now assume that during operation a dangerously high voltage appears across the terminals 11,12 when LED 13 is OFF and the switch is open. In this instance to provide protection to the transistors, the appropriate one of the thyristors will turn on and act to shunt most of the excess current to protect the transistors.

Absent the invention, a problem may arise when the abnormal voltage surges subside and the switch is supposed to turn off. If the thyristors are designed to have low holding current requirements, the normal operating voltages being applied to the switch can be sufficient to maintain the required holding current so that the thyristor will remain latched on.

However, by the use of the invention the high current initially through the appropriate thyristor accompanying the voltage surges will turn on its LED and the emitted light incident on photodiode array 25 and the photovoltaic voltage it generates will bias the transistors 14 and 15 to a conducting state. The capacitor 28 associated with the photodiode serves to store charge so that it will effectively prolong the time the photovoltaic voltage is effective.

When the transistors are turned on, they provide a shunt conduction path for current through the switch; and once the voltage surges have subsided and normal voltages return, this path diverts enough current from the conducting thyristor path that the thyristor no longer draws the required minimum holding current and, accordingly, it turns off, as is desired. Also by this time, the LED associated with this thyristor will have turned OFF and the photodiode array 25 no longer will provide a turn-on bias to the transistors 14 and 15 and they will turn off.

It will be appreciated that the invention is not critically dependent on the particular type of components employed so long as they meet the functional requirements described for the desired operation.

It should also be evident that various modifications of the specific circuits described should be feasible consistent with the desired optical feedback control.

In addition, it should be apparent that if only excessive surges of one polarity are to be expected because of the specific application involved, it will be possible to eliminate the thyristor branch that is no longer needed.

Additionally, it is to be expected that various of the components can be integrated into a common chip.

What is claimed is:

1. A switch comprising a transistor branch and at least one thyristor branch and in which the conducting state of the transistor branch is adapted to be controlled optically CHARACTERIZED IN THAT the thyristor branch includes a light source which is actuated by excess current through the thyristor branch and which is coupled to light sensitive means capable of controlling the conducting state of the transistor branch whereby excess current through the thyristor makes the transistor branch conductive.

2. A switch in accordance with claim 1 in which the transistor branch when conducting can divert excess current from the thyristor branch whereby in the absence of voltage surges the light source in the thyristor branch is OFF.

3. A switch in accordance with claim 2 in which the transistor branch comprises a pair of serially connected normally-off transistors and the node between these transistors is electrically connected to the gate of the thyristor whereby conduction in the transistor branch is adapted to trigger conduction in the thyristor branch.

4. A switch in accordance with claim 3 in which the thyristor is adapted to be turned ON in response to voltage surges of appropriate polarity independent of the conduction state of the transistor branch.

5. A switch in accordance with claim 4 which includes a pair of thyristor branches in parallel and oppositely poled.

6. A normally-OFF switch including a pair of terminals comprising means forming a first conduction path between said terminals including a pair of serially connected transistors biased to be normally-OFF, means forming a second conduction path between said terminals including a thyristor and a light source adapted to radiate when the current in the second path is sufficient, photosensitive means adapted to be illuminated selectively by control light and when illuminated to bias the transistors ON, photosensitive means adapted to be illuminated selectively by said light source and when illuminated to bias the transistors ON, and the gate of the thyristor being connected to the node between the transistors whereby triggering current is provided for the thyristor and further CHARACTERIZED IN THAT the thyristor is adapted to be turned ON by voltage surges between the terminals even when the transistors are OFF, and the resulting excess current causes radiation by the light source whereby the transistors are turned ON to divert enough current from the thyristor path that the thyristor is turned OFF when the voltage surges subside.

* * * * *